United States Patent
Lee et al.

(10) Patent No.: US 9,961,749 B1
(45) Date of Patent: May 1, 2018

(54) RF CONTROLLED SWITCH BOX WITHOUT USING NEUTRAL WIRE AND A POWER HARVESTING SWITCH CIRCUIT THEREOF

(71) Applicant: Climax Technology Co., LTD., Taipei (TW)

(72) Inventors: Pin-Chia Lee, Taipei (TW); Yu-Ling Chou, Taipei (TW); Lung-Shu Liu, Taipei (TW); Ku-Fang Wang, Taipei (TW)

(73) Assignee: Climax Technology Co., Ltd., Taipei (TW)

( * ) Notice: Subject to any disclaimer, the term of this patent is extended or adjusted under 35 U.S.C. 154(b) by 0 days. days.

(21) Appl. No.: 15/486,202

(22) Filed: Apr. 12, 2017

(51) Int. Cl.
*H05B 33/08* (2006.01)
*H05B 37/02* (2006.01)
*H02M 7/06* (2006.01)
*H01L 29/78* (2006.01)
*H01L 29/866* (2006.01)
*H05B 39/04* (2006.01)

(52) U.S. Cl.
CPC ..... *H05B 37/0245* (2013.01); *H01L 29/7801* (2013.01); *H01L 29/866* (2013.01); *H02M 7/06* (2013.01); *H05B 33/0845* (2013.01); *H05B 33/0887* (2013.01); *H05B 39/044* (2013.01)

(58) Field of Classification Search
CPC .......... H05B 33/08; H05B 33/0803; H05B 33/0806; H05B 33/0842; H05B 33/0877; H05B 39/02; H05B 39/04; H05B 39/044; H01L 29/86; H01L 29/861; H01L 29/866; H02N 2/181
See application file for complete search history.

(56) References Cited

U.S. PATENT DOCUMENTS

| | | | | |
|---|---|---|---|---|
| 7,781,943 B1* | 8/2010 | Hamel | | H02N 2/181 310/339 |
| 8,816,633 B1* | 8/2014 | Neal | | H02J 17/00 320/101 |
| 9,197,143 B1* | 11/2015 | Townsend | | H02N 2/181 |
| 9,698,768 B2* | 7/2017 | Leong | | H03K 17/167 |
| 2002/0011874 A1* | 1/2002 | Takahashi | | H03K 17/0822 327/50 |
| 2002/0171379 A1* | 11/2002 | Adamson | | G09G 3/2014 315/291 |
| 2008/0310195 A1* | 12/2008 | Seberger | | H02M 3/158 363/26 |
| 2009/0200952 A1* | 8/2009 | King | | H05B 39/044 315/206 |
| 2009/0309538 A1* | 12/2009 | Xu | | H01M 10/441 320/101 |
| 2010/0019778 A1* | 1/2010 | Park | | A61B 5/0031 324/652 |

(Continued)

OTHER PUBLICATIONS

Extended European Search Report dated Nov. 28, 2017 in related European Application No. 17167827.9.

*Primary Examiner* — Jason M Crawford
(74) *Attorney, Agent, or Firm* — Donald E. Stout

(57) ABSTRACT

A power harvesting switch circuit includes a main switch and a voltage extractor connected in series between Line wire and switch wire. The main switch includes a first power MOSFET and a second power MOSFET connected in series. The voltage extractor includes a first Zener diode and a second Zener diode connected in series but in opposite directions.

26 Claims, 7 Drawing Sheets

(56) References Cited

U.S. PATENT DOCUMENTS

| | | |
|---|---|---|
| 2010/0270982 A1 | 10/2010 | Hausman, Jr. et al. |
| 2011/0101789 A1* | 5/2011 | Salter, Jr. .............. H02M 7/217 |
| | | 307/104 |
| 2015/0189726 A1 | 7/2015 | Spira |
| 2015/0280782 A1 | 10/2015 | Airbinger et al. |
| 2017/0063432 A1* | 3/2017 | Martin ................... H02J 50/12 |

* cited by examiner

RF CONTROLLED SWITCH BOX WITHOUT USING NEUTRAL WIRE AND A POWER HARVESTING SWITCH CIRCUIT THEREOF

BACKGROUND OF THE INVENTION

1. Field of the Invention

The present invention generally relates to an RF controlled switch box without using Neutral wire adaptable to turning on or off a lamp, and more particularly to a power harvesting switch circuit of the RF controlled switch box.

2. Description of Related Art

Wireless networks have been commonly used for control of home automation due to low power consumption and low cost. A wireless power switch is ordinarily adopted in a wireless automation control system. Both terminals of the wireless power switch are normally connected to Line wire and Neutral wire of mains voltage, respectively. Alternating-current (AC) power supply is converted to direct-current (DC) power supply, which is then provided to a wireless controlled module of the wireless automation control system.

Switch boxes in some places, however, comprise the Line wire and a switch wire, but not the Neutral wire. A conventional wireless automation control system therefore needs to pull the Neutral wire additionally for a power device. The power device provides power for the wireless controlled module, which controls the power switch wirelessly. Nevertheless, the conventional wireless automation control system is implemented with increasing complexity and cost for lack of the Neutral wire in the switch box. In an alternative wireless automation control system, a battery is used instead as power supply, but causes inconvenience during battery replacement.

Conventional switch boxes are specifically designed for either a lamp with high impedance such as a light-emitting diode (LED) light bulb or a lamp with low impedance such as an incandescent lamp, but not both. Accordingly, for example, a switch box specifically designed for the incandescent lamps cannot be adapted to turn on or off the LED light bulbs. Moreover, overcurrent and overheating in the components of the conventional switch boxes may occur if lamps of improper type are adopted.

For the foregoing reasons, a need has arisen to propose a novel wireless automation control system without Neutral wire for turning on or off lamps.

SUMMARY OF THE INVENTION

In view of the foregoing, it is an object of the embodiment of the present invention to provide a power harvesting switch circuit adaptable to an RF controlled switch box without using Neutral wire to turn on or off a lamp such as an LED light bulb, an energy saving lamp or an incandescent lamp. The embodiment is capable of preventing overcurrent and overheating in the components of the power harvesting switch circuit. The embodiment is further capable of light dimming of the lamp.

According to one embodiment, a power harvesting switch circuit includes a main switch and a voltage extractor. The main switch includes a first power metal-oxide-semiconductor field-effect transistor (MOSFET) and a second power MOSFET connected in series. The voltage extractor includes a first Zener diode and a second Zener diode connected in series but in opposite directions. The main switch and the voltage extractor are connected in series between Line wire and switch wire for turning on or off a lamp that is connected between the switch wire and Neutral wire.

According to another embodiment, a radio frequency (RF) controlled switch box without using Neutral wire includes a power harvesting switch circuit connected between Line wire and switch wire and an RF controlled circuit that controls on-state or off-state of the power harvesting switch circuit via controlling signals. The power harvesting switch circuit includes a main switch and a voltage extractor. The main switch includes a first power MOSFET and a second power MOSFET connected in series. The voltage extractor includes a first Zener diode and a second Zener diode connected in series but in opposite directions. The main switch and the voltage extractor are connected in series for turning on or off a lamp that is connected between the switch wire and the Neutral wire.

DETAILED DESCRIPTION OF THE INVENTION

Figure 1:
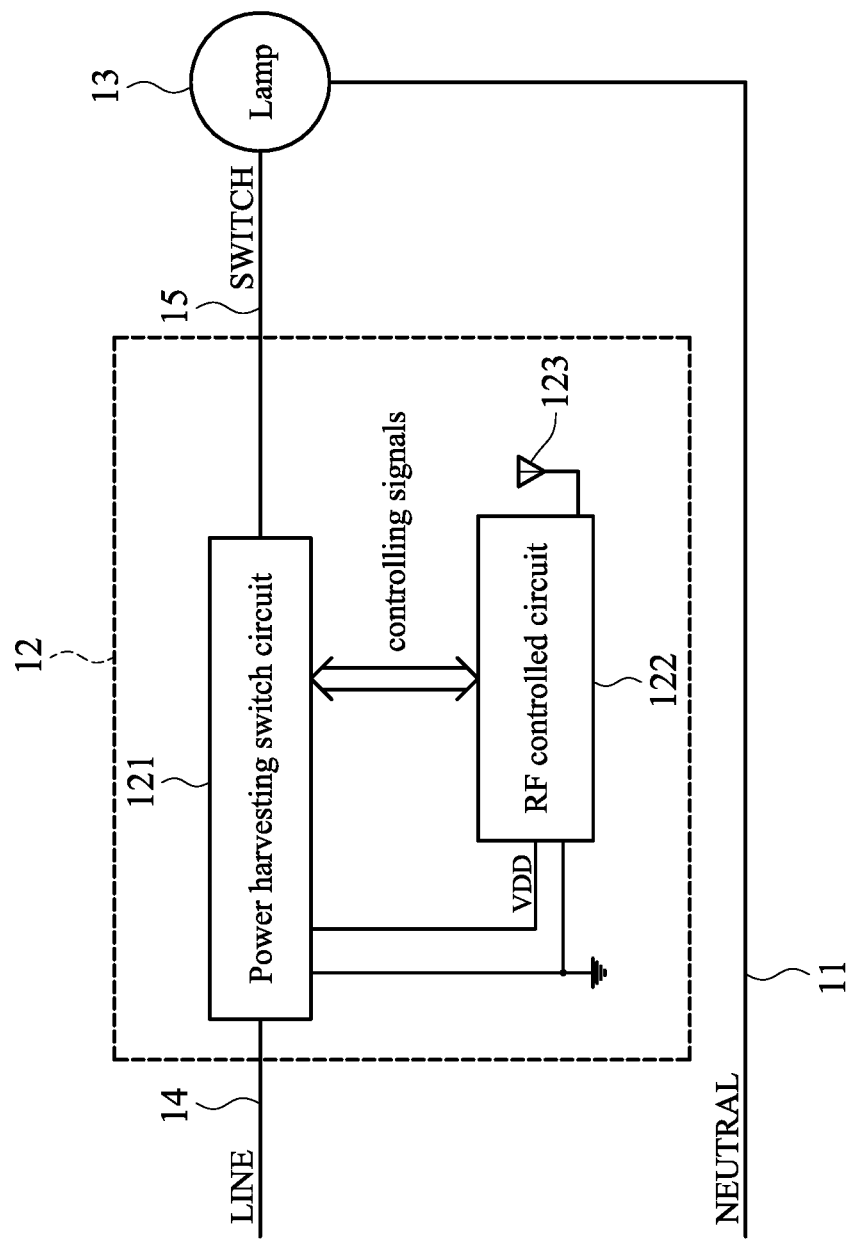
FIG. 1 shows a system block diagram illustrating a radio frequency (RF) controlled switch box without using Neutral wire adaptable to turning on or off a lamp according to one embodiment of the present invention.

FIG. 1 shows a system block diagram illustrating a radio frequency (RF) controlled switch box 12 without using Neutral wire adaptable to turning on or off a lamp 13 according to one embodiment of the present invention. The embodiment may be adaptable to a lamp with high impedance such as a light-emitting diode (LED) light bulb or an energy saving lamp, and may as well be adaptable to a lamp with low impedance such as an incandescent lamp.

The RF controlled switch box (switch box hereinafter) 12 of the embodiment may, but not necessarily, be a wall switch box. As shown in FIG. 1, the switch box 12 and the lamp 13 are connected in series between Line wire 14 and the Neutral wire 11 of mains power. According to one aspect of the embodiment, the switch box 12 is not connected to the Neutral wire 11. Specifically, one end of the switch box 12 is connected to the Line wire 14, and the other end of the switch box 12 is connected to a switch wire 15. According to regulations, the lamp 13 is connected between the switch wire 15 and the Neutral wire 11.

In the embodiment, the switch box 12 may include a power harvesting switch circuit 121, which is connected between the Line wire 14 and the switch wire 15. The power harvesting switch circuit 121 is at least capable of acting as a light switch and extracting power from (i.e., harvesting) the mains power as will be readily understood from the following descriptions. The lamp 13 turns on when the power harvesting switch circuit 121 is in on-state, and the lamp 13 turns off when the power harvesting switch circuit 121 is in off-state.

The switch box 12 of the embodiment may include an RF controlled circuit 122, which is configured to control on- or off-state of the power harvesting switch circuit 121 via controlling signals. In the embodiment, the controlling signals transferred between the power harvesting switch circuit 121 and the RF controlled circuit 122 include a gate controlling signal, current detect signals and bypass controlling signals. According to another aspect of the embodiment, the RF controlled circuit 122 receives RF wave via an antenna 123 to facilitate remote and wireless control of on- or off-state of the power harvesting switch circuit 121, and the on- or off-state of the power harvesting switch circuit 121 is controlled by the gate controlling signal. Alternatively, the switch box 12 of the embodiment may optionally include a manual switch device (not shown) for generating a manual switch signal for the RF controlled circuit 122 in a manual manner, thereby controlling on- or off-state of the power harvesting switch circuit 121.

Figure 2:
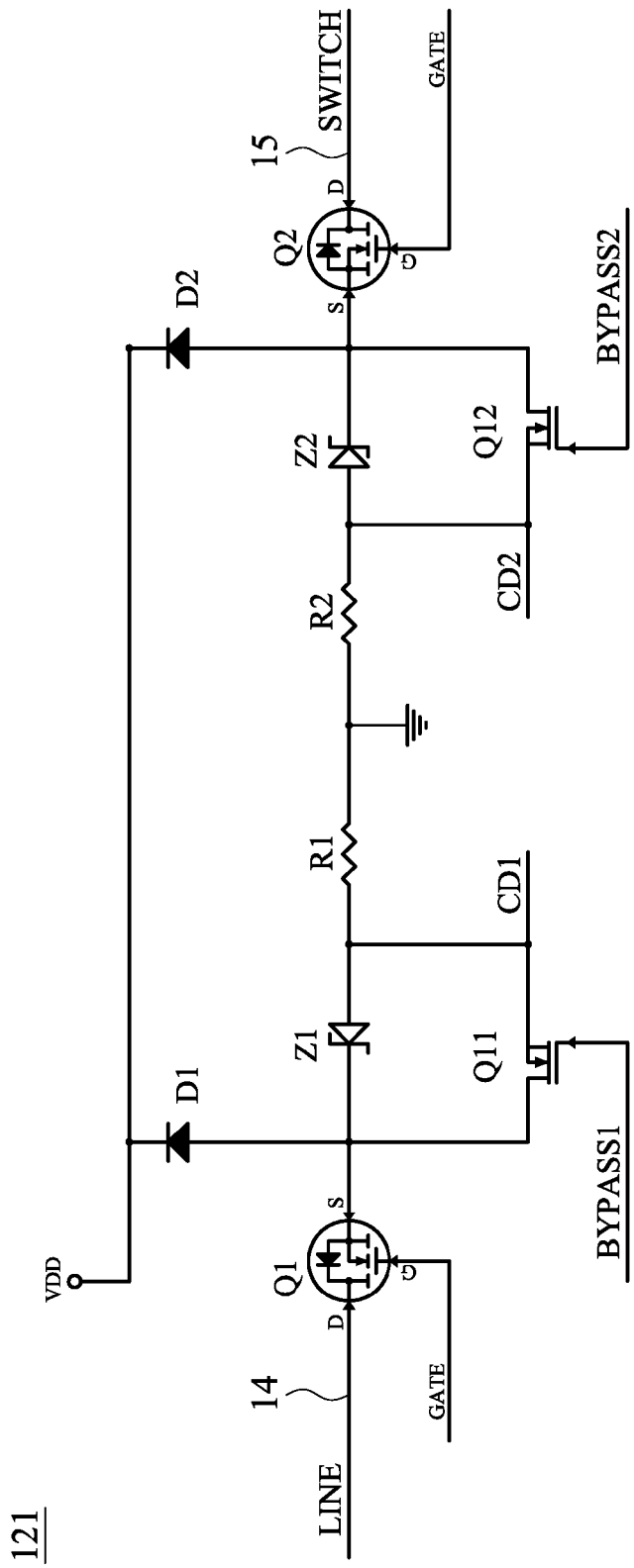
FIG. 2 shows a detailed circuit diagram of the power harvesting switch circuit of FIG. 1.

FIG. 2 shows a detailed circuit diagram of the power harvesting switch circuit 121 of FIG. 1. In the embodiment, the power harvesting switch circuit 121 may include a main switch and a voltage extractor connected in series between the Line wire 14 and the switch wire 15. The main switch of the embodiment may be controlled by a main switch controlling signal provided by the RF controlled circuit 122. The main switch may include two power metal-oxide-semiconductor field-effect transistors (MOSFETs) (e.g., N-channel MOSFETs), that is, a first power MOSFET Q1 and a second power MOSFET Q2, which are connected in series. Specifically, a drain D of the first power MOSFET Q1 is connected to the Line wire 14, and a drain D of the second power MOSFET Q2 is connected to the switch wire 15. Gates G of the first and second power MOSFETs Q1 and Q2 are jointly coupled to receive a main switch controlling signal (e.g., a gate controlling signal) provided by the RF controlled circuit 122.

The voltage extractor of the embodiment may include two Zener diodes (e.g., each having Zener voltage of 6 volts), that is, a first Zener diode Z1 and a second Zeiler diode Z2, which are connected in series but in opposite directions. Specifically, the cathode of the first Zener diode Z1 is connected to a source S of the first power MOSFET Q1, and the cathode of the second Zener diode Z2 is connected to a source S of the second power MOSFET Q2.

The power harvesting switch circuit 121 of the embodiment may further include a current detector and a bypass switch, which collectively prevent overcurrent and overheating in the first and second Zener diodes Z1 and Z2. Specifically, the current detector of the embodiment may be connected in series with the main switch and the voltage extractor, and may include two resistors (e.g., each having electrical resistance of 0.2 ohms) as current sensors, that is, a first resistor R1 and a second resistor R2, which are connected in series. A first end of the first resistor R1 is connected to the anode of the first Zener diode Z1, a first end of the second resistor R2 is connected to the anode of the second Zener diode Z2, and second ends of the first and second resistors R1 and R2 are connected together as a system ground or signal ground (ground hereinafter) for the switch box 12. The first ends of the first and second resistors R1 and R2 provide a first current detect signal CD1 and a second current detect signal CD2, respectively.

Figure 3:
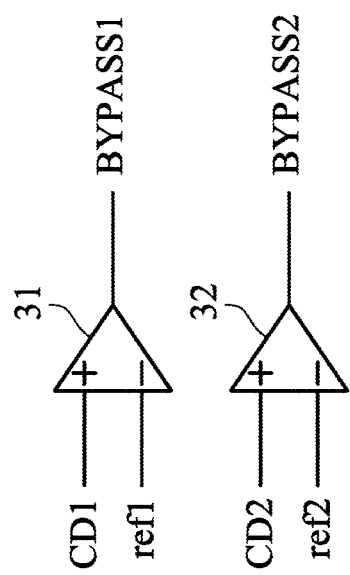
FIG. 3 shows circuit diagrams of a first comparator and a second comparator configured to generate the first bypass controlling signal and the second bypass controlling signal, respectively.

The bypass switch of the embodiment may include two current shunt transistors, that is, a first current shunt transistor Q11 and a second current shunt transistor Q12, which are connected in parallel with the first and second Zener diodes Z1 and Z2, respectively. Specifically, source and drain of the first current shunt transistor Q11 are respectively connected to the anode and the cathode of the first Zener diode Z1, and, similarly, source and drain of the second current shunt transistor Q12 are respectively connected to the anode and the cathode of the second Zener diode Z2. Gates of the first and second current shunt transistors Q11 and Q12 are coupled to receive a first bypass controlling signal BYPASS1 and a second bypass controlling signal BYPASS2, respectively. FIG. 3 shows circuit diagrams of a first comparator 31 and a second comparator 32 configured to generate the first bypass controlling signal BYPASS1 and the second bypass controlling signal BYPASS2, respectively. Specifically, the first comparator 31 (e.g., an operational amplifier) has a non-inverting input end coupled to receive the first current detect signal CD1, has an inverting input end coupled to receive a first reference voltage ref1 which corresponds to an overcurrent threshold level, and has an output end configured to generate the first bypass controlling signal BYPASS1. Similarly, a second comparator 32 (e.g., an operational amplifier) has a non-inverting input end coupled to receive the second current detect signal CD2, has an inverting input end coupled to receive a second reference voltage ref2 which corresponds to an overcurrent threshold level, and has an output end configured to generate the second bypass controlling signal BYPASS2.

The power harvesting switch circuit 121 of the embodiment may further include a rectifier, which is configured to convert an extracted voltage (from the voltage extractor Z1 and Z2) into a rectified voltage VDD. The rectifier of the embodiment may include two rectifier diodes, that is, a first rectifier diode D1 and a second rectifier diode D2. Specifically, the anode of the first rectifier diode D1 is connected to the cathode of the first Zener diode Z1, the anode of the second rectifier diode D2 is connected to the cathode of the second Zener diode Z2, and cathodes of the first and second rectifier diodes Z1 and Z2 are connected together to furnish the rectified voltage VDD that is provided to the RF controlled circuit 122 (FIG. 1).

Figure 4:
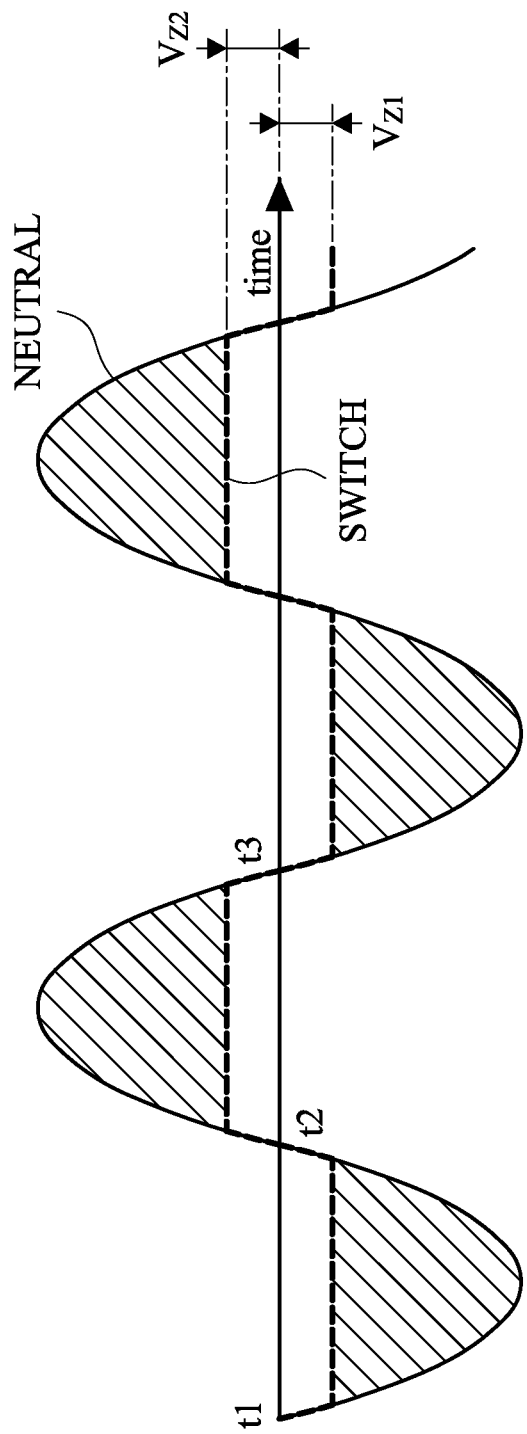
FIG. 4 shows exemplary waveforms of the Neutral wire and the switch wire using the Line wire as a reference voltage when the power harvesting switch circuit is in on-state to turn on the lamp.

FIG. 4 shows exemplary waveforms of the Neutral wire 11 and the switch wire 15 using the Line wire 14 as a reference voltage when the power harvesting switch circuit 121 is in on-state to turn on the lamp 13. The difference between the Neutral wire 11 and the switch wire 15, as denoted by slant lines, represents the voltage consumed by the lamp 13.

In a first half-period of the mains power, e.g., t1 to t2, the gates G of the first and second power MOSFETs Q1 and Q2 are jointly coupled to receive a gate controlling voltage $V_{gate}$ (from the RF controlled circuit 122) that satisfies the following condition:

$$V_{gate} > V_{Z1} + V_{GS1\text{-}ON}$$

where $V_{Z1}$ is a Zener voltage of the first Zener diode Z1, and $V_{GS1\text{-}ON}$ is a threshold voltage of the first power MOSFET Q1.

In the first half-period of the mains power, the first power MOSFET Q1 turns on, the first Zener diode Z1 is reverse-biased with the Zener voltage $V_{Z1}$, the second Zener diode Z2 is forward-biased, a current flows through an (internal) body diode (with the anode connected to source S and the cathode connected to drain D as shown in FIG. 2) of the second power MOSFET Q2, the first rectifier diode D1 turns on, and the second rectifier diode D2 turns off.

Subsequently, in a second half-period of the mains power, for example, t2 to t3, the gates G of the first and second power MOSFETs Q1 and Q2 are jointly coupled to receive the gate controlling voltage $V_{gate}$ (from the RF controlled circuit 122) that satisfies the following condition:

$$V_{gate} > V_{Z2} + V_{GS2\text{-}ON}$$

where $V_{Z2}$ is a Zener voltage of the second Zener diode Z2, and $V_{GS2\_ON}$ is a threshold voltage of the second power MOSFET Q2.

In the second half-period of the mains power, the second power MOSFET Q2 turns on, the second Zener diode Z2 is reverse-biased with the Zener voltage $V_{Z2}$, the first Zener diode Z1 is forward-biased, a current flows through an (internal) body diode (with the anode connected to source S and the cathode connected to drain D as shown in FIG. 2) of the first power MOSFET Q1, the second rectifier diode D2 turns on, and the first rectifier diode D1 turns off.

In either the first or second half-period of the mains power, if the first/second current detect signal CD1/CD2 exceeds the first/second reference voltage ref1/ref2, the generated first/second bypass controlling signal BYPASS1/BYPASS2 then turns on the first/second current shunt transistor Q11/Q12, which accordingly bypasses the first/second Zener diode Z1/Z2, thereby preventing overcurrent and overheating in the first and second Zener diodes Z1 and Z2. In practice, the first/second current shunt transistor Q11/Q12 may ordinarily be turned on for a lamp 13 with low impedance, such as an incandescent lamp, for which overcurrent and overheating would occur in the first/second Zener diode Z1/Z2 without being bypassed. On the other hand, the first/second current shunt transistor Q11/Q12 may ordinarily be turned off for a lamp 13 with high impedance, such as an LED light bulb or an energy saving lamp, for which a low current flows with substantially low heat in the first/second Zener diode Z1/Z2.

According to a further aspect of the embodiment, the first/second power MOSFET Q1/Q2 may be utilized to control the intensity of the light output of, or alternatively speaking to dim, the lamp 13. Specifically, the first/second power MOSFET Q1/Q2 may turn on, under control of the gate controlling signal, within an adjustable portion of the first/second half-period, thereby altering the voltage waveform applied to the lamp 13 and accordingly changing its root mean square (RMS) effective value to facilitate light dimming of the lamp 13. The larger the turn-on portion is, the brighter the lamp 13 is, and vice versa. Compared with conventional light dimming using triode for alternating current (TRIAC), the light dimming utilizing the first/second power MOSFET Q1/Q2 in the embodiment generates substantially less heat for the reasons that the drain to source resistance in on-state Rds(on) of the power MOSFET is considerably less than the resistance in one-state of the TRIAC.

Figure 5:
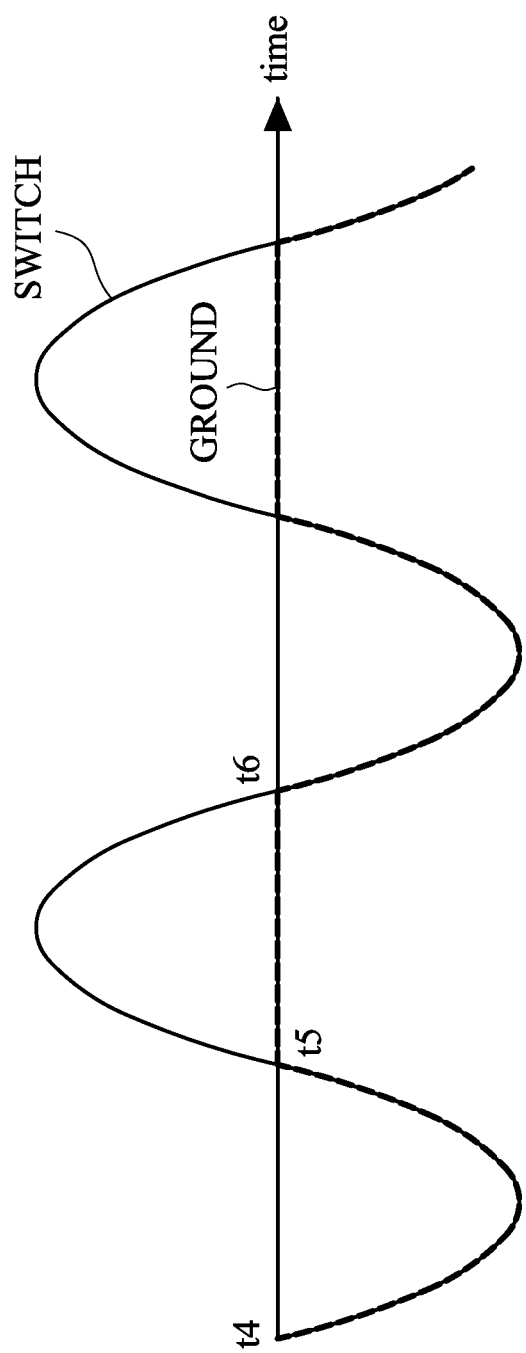
FIG. 5 shows exemplary waveforms of the ground and the switch wire using the Line wire as a reference voltage when the power harvesting switch circuit is in off-state to turn off the lamp.

FIG. 5 shows exemplary waveforms of the ground and the switch wire 15 using the Line wire 14 as a reference voltage when the power harvesting switch circuit 121 is in off-state to turn off the lamp 13. In a first half-period of the mains power, e.g., t4 to t5, the ground voltage follows the voltage of the switch wire 15 in the first half-period of mains power.

In a second half-period of the mains power, e.g., t5 to t6, the ground voltage remains at zero in the second half-period of mains power.

Figure 6:
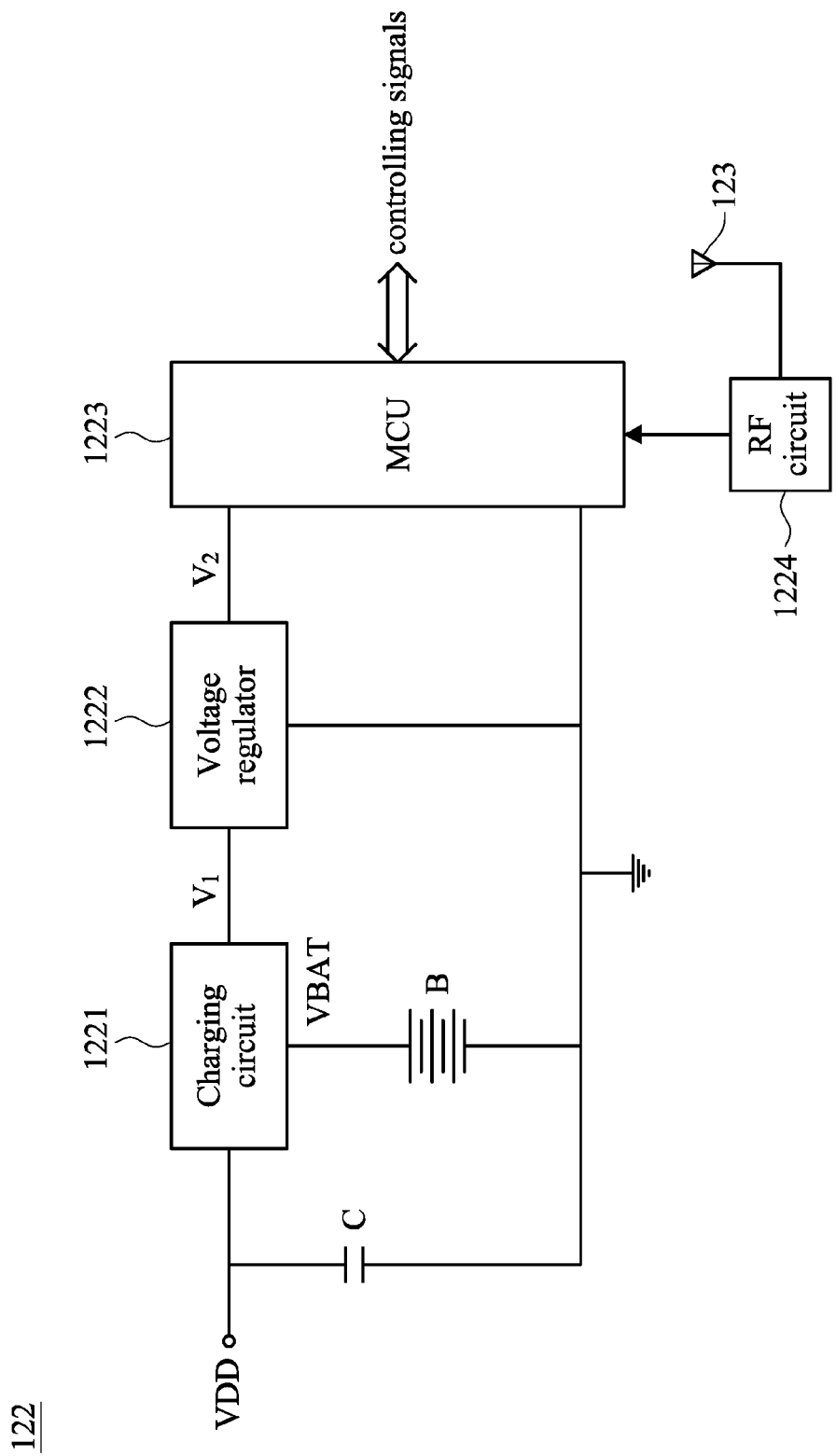
FIG. 6 shows a detailed block diagram of the RF controlled circuit of FIG. 1.

FIG. 6 shows a detailed block diagram of the RF controlled circuit 122 of FIG. 1. In the embodiment, the RF controlled circuit 122 may include a smoothing capacitor C connected between the rectified voltage VDD and the ground in order to reduce the ripple of the rectified voltage VDD.

Figure 7:
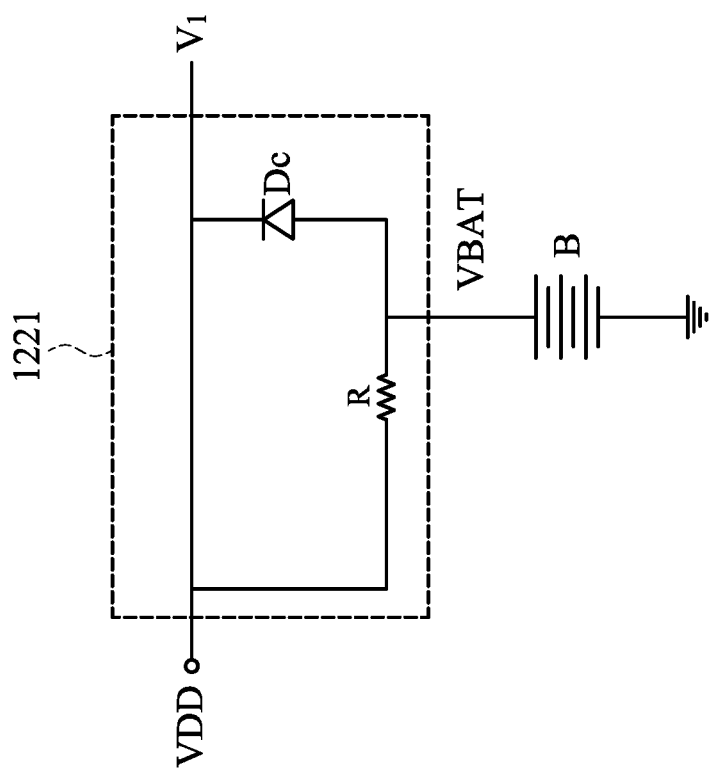
FIG. 7 shows a detailed circuit diagram of the charging circuit of FIG. 6.

The RF controlled circuit 122 may include a charging circuit 1221 that receives the rectified voltage VDD. FIG. 7 shows a detailed circuit diagram of the charging circuit 1221 of FIG. 6. In the embodiment, the charging circuit 1221 may include a charging diode Dc, forward connected between a positive terminal of a rechargeable battery B and an output end (i.e., $V_1$) of the charging circuit 1221. The charging circuit 1221 may further include a current limiting resistor R connected between an input end (i.e., VDD) of the charging circuit 1221 and the positive terminal of the rechargeable battery B.

When the first/second rectifier diode D1/D2 provides a substantial rectified voltage VDD, the charging diode Dc is reverse-biased as the rectified voltage VDD is greater than a charging voltage VBAT generated by the rechargeable battery B. Therefore, the rectified voltage VDD charges the rechargeable battery B via the current limiting resistor R. As a result, a power supply voltage $V_1$ at the output end of the charging circuit 1221 is equal to the rectified voltage VDD.

When the first/second rectifier diode D1/D2 provides an insubstantial rectified voltage VDD (e.g., when AC voltage of mains power is less than Zener voltage $Vz_1/V_{Z2}$ or the first/second power MOSFET Q1/Q2 turns off), the charging diode Dc is forward-biased as the rectified voltage VDD is less than the charging voltage VBAT. Therefore, the charging voltage VBAT acts as the power supply voltage $V_1$ via the charging diode Dc. The rechargeable battery B discharges via the charging diode Dc, and the power supply voltage $V_1$ is substantially equal to the charging voltage VBAT, if the voltage drop across the charging diode Dc is neglected.

The RF controlled circuit 122 may further include a voltage regulator 1222, which receives the power supply voltage $V_1$ and then accordingly generates a regulated voltage $V_2$. The regulated voltage $V_2$ is normally less than the power supply voltage $V_1$.

The RF controlled circuit 122 may include a microcontroller unit (MCU) 1223, which is coupled to receive the regulated voltage $V_2$ as a power supply. If the charging circuit 1221 can output a proper and stable power supply voltage $V_1$ to the MCU 1223, the voltage regulator 1222 may be omitted and the power supply voltage $V_1$ is used instead as the power supply to the MCU 1223. The MCU 1223 of the embodiment may perform multiple functions. For example, the MCU 1223 may receive an RF controlling signal, which is generated by an RF circuit 1224 that processes RF wave received from the antenna 123. The MCU 1223 generates controlling signals (e.g., the gate controlling signal and the bypass controlling signals) to control on- or off-state of the power harvesting switch circuit 121 according to the RF controlling signal. Accordingly, the MCU 1223 can remotely and wirelessly control on- or off-state of the power harvesting switch circuit 121.

Although specific embodiments have been illustrated and described, it will be appreciated by those skilled in the art that various modifications may be made without departing from the scope of the present invention, which is intended to be limited solely by the appended claims.

What is claimed is:

1. A power harvesting switch circuit, comprising:
   a main switch including a first power metal-oxide-semiconductor field-effect transistor (MOSFET) and a second power MOSFET connected in series; and
   a voltage extractor including a first Zener diode and a second Zener diode connected in series but in opposite directions;
   wherein the main switch and the voltage extractor are connected in series between Line wire and switch wire for turning on or off a lamp that is connected between the switch wire and Neutral wire.

2. The circuit of claim 1, wherein the lamp comprises a light-emitting diode light bulb, an energy saving lamp or an incandescent lamp.

3. The circuit of claim 1, wherein a drain of the first power MOSFET is connected to the Line wire, and a drain of the second power MOSFET is connected to the switch wire, gates of the first power MOSFET and the second power MOSFET are jointly coupled to receive a gate controlling signal.

4. The circuit of claim 3, wherein the first power MOSFET and the second power MOSFET turn on, under control of the gate controlling signal, within an adjustable portion of time, thereby dimming the lamp.

5. The circuit of claim 3, wherein cathode of the first Zener diode is connected to a source of the first power MOSFET, and cathode of the second Zener diode is connected to a source of the second power MOSFET.

6. The circuit of claim 5, further comprising:
   a current detector connected in series with the main switch and the voltage extractor; and
   a bypass switch;
   wherein the current detector and the bypass switch collectively prevent overcurrent and overheating in the voltage extractor.

7. The circuit of claim 6, wherein the current detector comprises a first resistor and a second resistor connected in series, and the bypass switch comprises a first current shunt transistor and a second current shunt transistor that are connected in parallel with the first Zener diode and the second Zener diodes respectively.

8. The circuit of claim 7, wherein a first end of the first resistor is connected to the anode of the first Zener diode, a first end of the second resistor is connected to the anode of the second Zener diode, and second ends of the first resistor and the second resistor are connected together as a system ground, wherein the first ends of the first resistor and the second resistor provide a first current detect signal and a second current detect signal respectively.

9. The circuit of claim 8, wherein a source and a drain of the first current shunt transistor are respectively connected to the anode and the cathode of the first Zener diode, a source and a drain of the second current shunt transistor are respectively connected to the anode and the cathode of the second Zener diode, and gates of the first and second current shunt transistors are coupled to receive a first bypass controlling signal and a second bypass controlling signal respectively.

10. The circuit of claim 9, further comprising:
    a first comparator having a non-inverting input end coupled to receive the first current detect signal, an inverting input end coupled to receive a first reference voltage, and an output end for generating the first bypass controlling signal; and
    a second comparator having a non-inverting input end coupled to receive the second current detect signal, an inverting input end coupled to receive a second reference voltage, and an output end for generating the second bypass controlling signal.

11. The circuit of claim 8, further comprising a rectifier that converts an extracted voltage from the voltage extractor into a rectified voltage.

12. The circuit of claim 11, wherein the rectifier comprises a first rectifier diode and a second rectifier diode, wherein anode of the first rectifier diode is connected to the cathode of the first Zener diode, anode of the second rectifier diode is connected to the cathode of the second Zener diode, and cathodes of the first rectifier diode and the second rectifier diode are connected together to furnish the rectified voltage.

13. A radio frequency (RF) controlled switch box without using Neutral wire, comprising:
    a power harvesting switch circuit connected between Line wire and switch wire;
    an RF controlled circuit that controls on-state or off-state of the power harvesting switch circuit via controlling signals;
    wherein the power harvesting switch circuit includes:
      a main switch including a first power metal-oxide-semiconductor field-effect transistor (MOSFET) and a second power MOSFET connected in series; and
      a voltage extractor including a first Zener diode and a second Zener diode connected in series but in opposite directions;
    wherein the main switch and the voltage extractor are connected in series for turning on or off a lamp that is connected between the switch wire and the Neutral wire.

14. The switch box of claim 13, wherein the RF controlled circuit receives RF wave via an antenna to facilitate remote and wireless control of on-state or off-state of the power harvesting switch circuit, wherein the lamp turns on when the power harvesting switch circuit is in on-state, and the lamp turns off when the power harvesting switch circuit is in off-state.

15. The switch box of claim 13, wherein the lamp comprises a light-emitting diode light bulb, an energy saving lamp or an incandescent lamp.

16. The switch box of claim 13, wherein a drain of the first power MOSFET is connected to the Line wire, and a drain of the second power MOSFET is connected to the switch wire, gates of the first power MOSFET and the second power MOSFET are jointly coupled to receive a gate controlling signal.

17. The switch box of claim 16, wherein the first power MOSFET and the second power MOSFET turn on, under control of the gate controlling signal, within an adjustable portion of time, thereby dimming the lamp.

18. The switch box of claim 16, wherein cathode of the first Zener diode is connected to a source of the first power MOSFET, and cathode of the second Zener diode is connected to a source of the second power MOSFET.

19. The switch box of claim 18, further comprising:
    a current detector connected in series with the main switch and the voltage extractor; and
    a bypass switch;
    wherein the current detector and the bypass switch collectively prevent overcurrent and overheating in the voltage extractor.

20. The switch box of claim 19, wherein the current detector comprises a first resistor and a second resistor connected in series, and the bypass switch comprises a first current shunt transistor and a second current shunt transistor that are connected in parallel with the first Zener diode and the second Zener diodes respectively.

21. The switch box of claim 20, wherein a first end of the first resistor is connected to the anode of the first Zener diode, a first end of the second resistor is connected to the anode of the second Zener diode, and second ends of the first resistor and the second resistor are connected together as a system ground, wherein the first ends of the first resistor and the second resistor provide a first current detect signal and a second current detect signal respectively.

22. The switch box of claim 21, further comprising a rectifier that comprises a first rectifier diode and a second rectifier diode, wherein anode of the first rectifier diode is connected to the cathode of the first Zener diode, anode of the second rectifier diode is connected to the cathode of the second Zener diode, and cathodes of the first rectifier diode and the second rectifier diode are connected together to furnish a rectified voltage.

23. The switch box of claim 22, wherein the RF controlled circuit comprises a smoothing capacitor connected between the rectified voltage and the system ground.

24. The switch box of claim 23, wherein the RF controlled circuit comprises a charging circuit having an input end coupled to receive the rectified voltage and an output end providing a power supply voltage, the charging circuit includes:
  a charging diode forward connected between a positive terminal of a rechargeable battery and the output end of the charging circuit; and
  a current limiting resistor connected between the input end of the charging circuit and the positive terminal of the rechargeable battery.

25. The switch box of claim 24, wherein the RF controlled circuit comprises a voltage regulator, which receives the power supply voltage and then accordingly generates a regulated voltage.

26. The switch box of claim 25, wherein the RF controlled circuit comprises a microcontroller unit coupled to receive the regulated voltage as a power supply, wherein the microcontroller unit generates the controlling signals to control on-state or off-state of the power harvesting switch circuit according to an RF controlling signal.

\* \* \* \* \*